United States Patent
Kahmen

(10) Patent No.: US 9,299,499 B2
(45) Date of Patent: Mar. 29, 2016

(54) VARACTOR AND VARACTOR SYSTEM

(71) Applicant: Rohde & Schwarz GmbH & Co. KG, Munich (DE)

(72) Inventor: Gerhard Kahmen, Oberhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 163 days.

(21) Appl. No.: 14/249,989

(22) Filed: Apr. 10, 2014

(65) Prior Publication Data

US 2014/0307361 A1 Oct. 16, 2014

(30) Foreign Application Priority Data

Apr. 11, 2013 (DE) .............................. 102013206434
Jun. 19, 2013 (DE) .............................. 102013211482

(51) Int. Cl.
*H01G 5/16* (2006.01)
*B81B 7/00* (2006.01)
*B81B 3/00* (2006.01)

(52) U.S. Cl.
CPC ................ *H01G 5/16* (2013.01); *B81B 3/0078* (2013.01); *B81B 7/00* (2013.01); *B81B 2201/0221* (2013.01)

(58) Field of Classification Search
CPC ....................................................... H01G 5/16
USPC ......................................... 361/280, 281, 290
See application file for complete search history.

(56) References Cited

U.S. PATENT DOCUMENTS

| | | | |
|---|---|---|---|
| 2006/0171097 A1* | 8/2006 | Shimanouchi | H01G 5/18 361/277 |
| 2009/0009925 A1* | 1/2009 | Hilgers | H01G 5/18 361/277 |
| 2012/0092228 A1* | 4/2012 | Ishida | H01Q 1/243 343/861 |

FOREIGN PATENT DOCUMENTS

WO 2004038848 A2 5/2004

* cited by examiner

*Primary Examiner* — Dion R Ferguson
(74) *Attorney, Agent, or Firm* — Ditthavong & Steiner, P.C.

(57) ABSTRACT

The invention relates to a varactor with an actuator, wherein the first actuator surface (2a) of the actuator is embodied on a substrate (1), and a second actuator surface (2b) is embodied on a first movable membrane (3a). In this context, the first movable membrane (3a) is arranged above an upper side (1a) of the substrate (1). A second movable membrane (2b) is arranged below a lower side (1b) of the substrate (1) facing away from the upper side (1a). The invention further relates to a varactor system made from two such varactors.

19 Claims, 6 Drawing Sheets

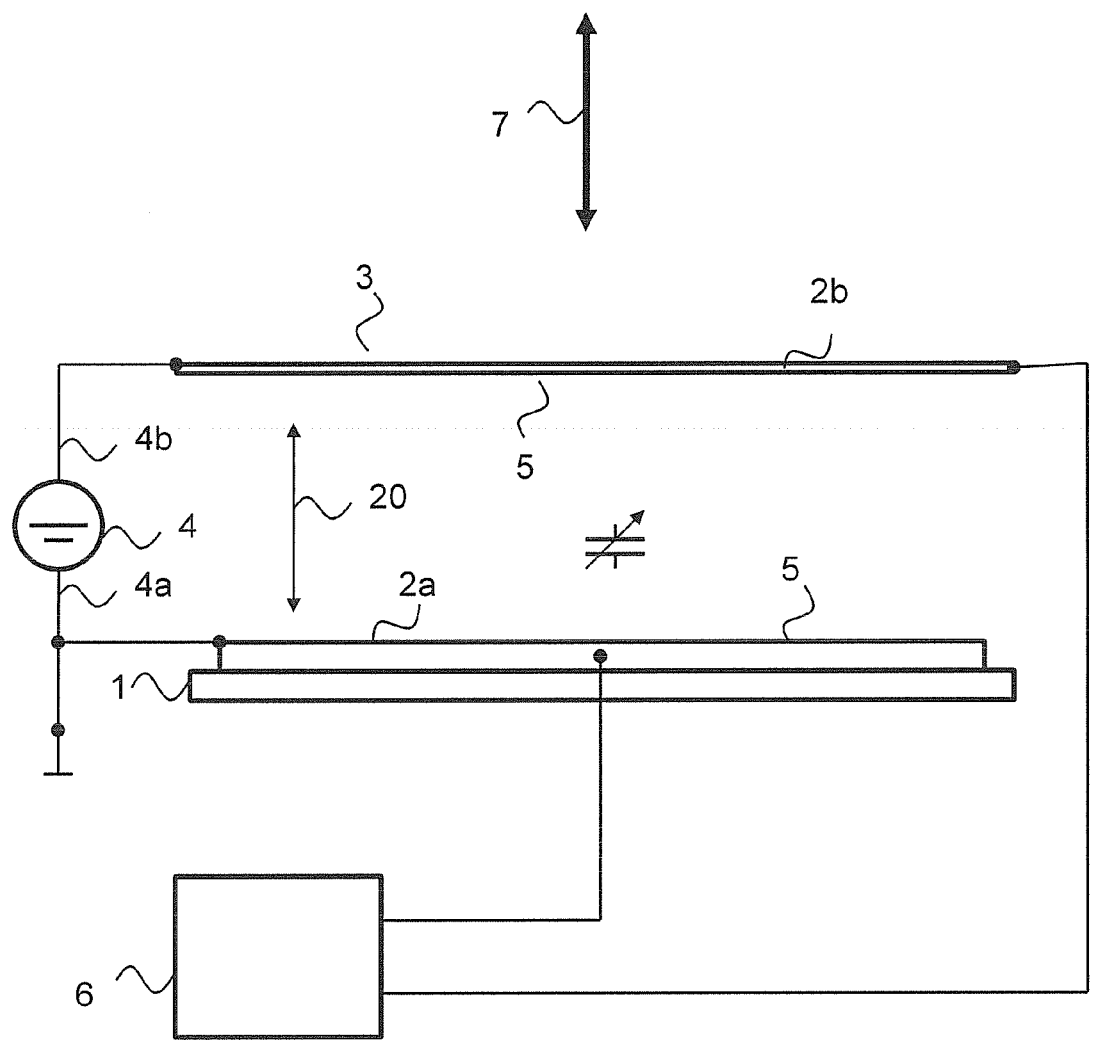
Fig. 1 – Prior Art

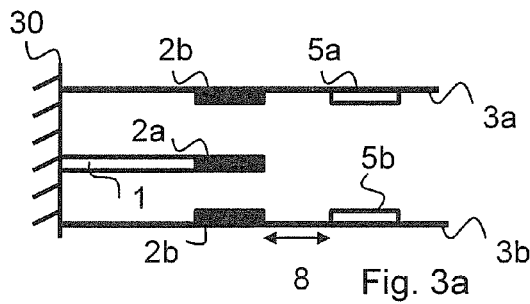
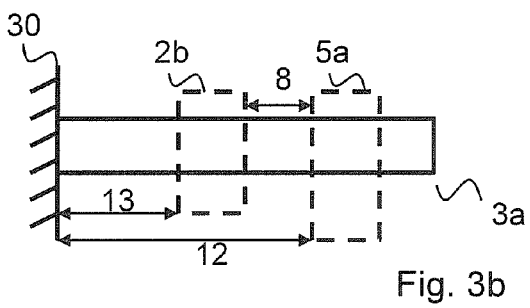
Fig. 3a
Fig. 3b
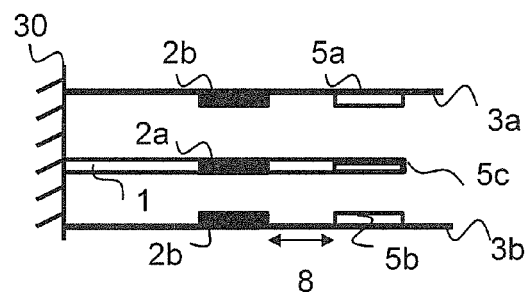
Fig. 4
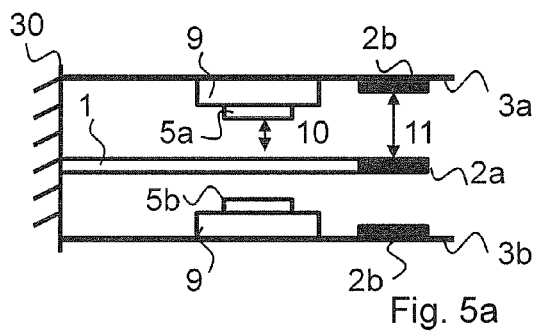
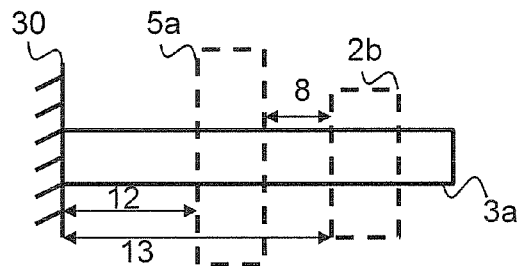
Fig. 5a
Fig. 5b
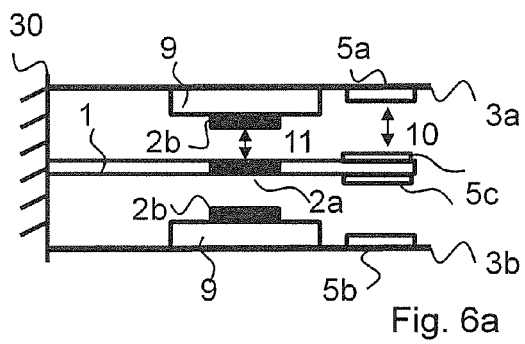
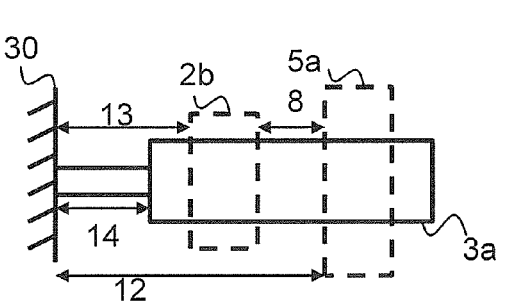
Fig. 6a
Fig. 6b

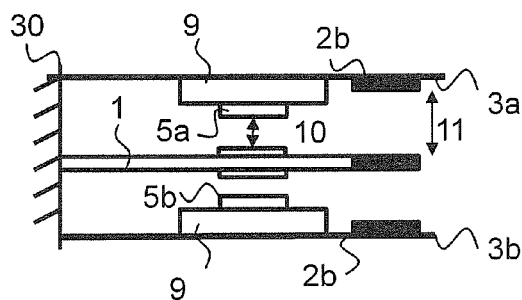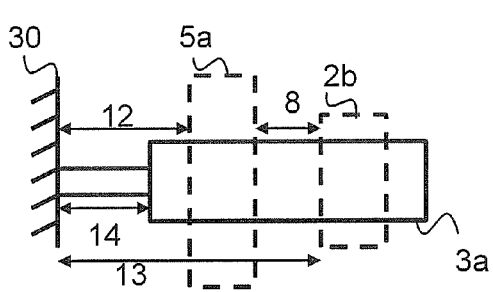
Fig. 7a Fig. 7b
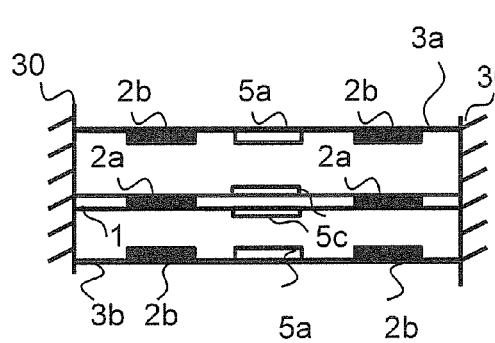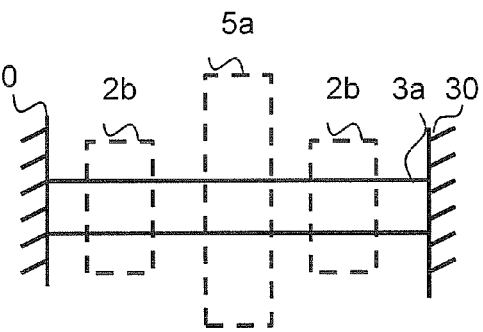
Fig. 8a Fig. 8b
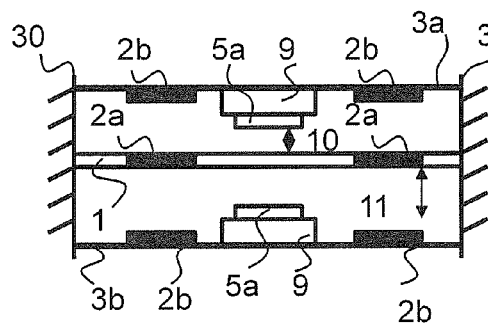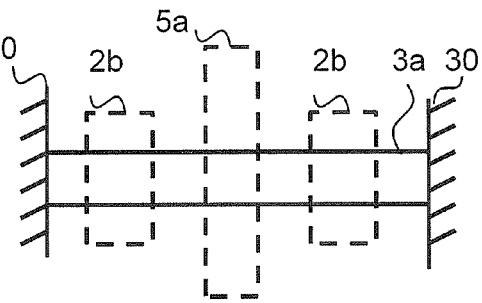
Fig. 9a Fig. 9b

VARACTOR AND VARACTOR SYSTEM

FIELD OF THE INVENTION

In high-frequency technology, varactors are used as tunable capacitors to vary the properties of circuits. For this purpose, a variable direct voltage is applied to the varactor, wherein the varactor behaves like a capacitor with capacitance dependent upon the direct voltage.

Hitherto, semiconductor diodes based on silicon or gallium-arsenide have been used as varactors. Such varactors are also referred to as varicaps or capacitance diodes.

BACKGROUND OF THE INVENTION

An alternative approach to the manufacture of varactors is to realise them using micro-system technology, also designated as Micro-Electro-Mechanical Systems, abbreviated as MEMS. A MEMS part is a miniaturised part of which the components provide dimensions in the micrometer range. The individual components work together as a system.

MEMS-based varactors provide a metallic membrane which is mounted in a movable manner above an actuator electrode. If a direct voltage is applied between the actuator electrode and the metallic membrane, the electrostatic forces of the actuator cause a displacement of the membrane. A variation in the potential of the direct voltage changes the distance between actuator electrode and metallic membrane. The actuator electrode and the metallic membrane represent a plate capacitor from which a capacitance value can be tapped.

Because of the variable distance between the membrane and the actuator, the capacitance value is variable. Such tunable capacitors are used, for example, in Voltage Controlled Oscillators VCO (Voltage Controlled Oscillators) in order to adjust the oscillation frequency.

Such a varactor is described in WO 2004/038848 A2. In this context, a movable membrane is arranged between two substrate layers. A varactor with high-quality and a broad tuning range can be manufactured through embodiment with two substrate layers.

MEMS-based varactors provide a high sensitivity to mechanical vibrations, oscillations and accelerations. As a result of the mechanical mode of operation, accelerations on the varactor influence the adjusted capacitance value. Because of this property, MEMS-varactors are also used as acceleration sensors.

This sensitivity to acceleration is disadvantageous if the varactor is supposed to provide an adjustable but constant capacitance value, for example, for applications in information technology and high-frequency technology.

An object of the present invention is therefore to provide a varactor and a varactor system which provides an adjustable but stable capacitance value. In particular, the varactor should be embodied to be resistant to influences based on an acceleration of the varactor.

SUMMARY OF THE INVENTION

In particular, the object is achieved by a varactor with an actuator, wherein a first actuator surface of the actuator is embodied on a substrate, and a second actuator surface is embodied on a first movable membrane. The varactor additionally provides a second movable membrane. The first movable membrane is arranged above an upper side of the substrate. The second movable membrane is arranged below a lower side of the substrate facing away from the upper side.

If an acceleration force is applied to the varactor according to the invention, both the first membrane and also the second membrane move in the same direction. Accordingly, the distance between the first membrane and the first actuator surface becomes larger, however, the distance between the second membrane and the first actuator surface becomes correspondingly smaller. The capacitance value between the first movable membrane and the first actuator surface therefore does in fact increase. However, the capacitance value between the second movable membrane and the first actuator surface is reduced correspondingly.

In this context, the substrate should be provided in the varactor as a rigid element.

If the capacitance value of the varactor according to the invention is tapped between the first movable membrane and the second movable membrane, the tapped capacitance value of the varactor is constant because the directions of movement of the movable membranes are the same.

Alternatively, a first capacitance value of the varactor according to the invention is tapped, wherein the first capacitance value is adjusted between the first movable membrane and the first actuator surface. Furthermore, a second capacitance value of the varactor according to the invention is tapped, wherein the second capacitance value is adjusted between the second movable membrane and the first actuator surface. If the first capacitance value and the second capacitance value are connected in parallel, the resulting total capacitance value is also constant.

Accordingly, the influence of the force of acceleration caused by an acceleration of the varactor or mechanical vibration of the varactor is approximately without influence on the capacitance value of the varactor according to the invention.

In a first advantageous embodiment, the first actuator surface provides an electrically conducting connection to a first terminal of a direct-voltage source, and the second actuator surface provides an electrically conducting connection to a second terminal of the direct-voltage source. In the direct-voltage source, an adjustable direct voltage which is set to form an electrostatic force on the first movable membrane and on the second movable membrane is applied.

Accordingly, the capacitance value of the varactor according to the invention, which is stable with regard to accelerations, is advantageously made to be adjustable by means of a voltage. Such a varactor can thus be used as a tunable capacitor.

By preference, the first movable membrane provides a first capacitor surface, and the second movable membrane provides a second capacitor surface. Accordingly, a variable capacitor is achieved, which is particularly resistant to acceleration.

In a preferred embodiment, the first actuator surface on the substrate is also a third capacitor surface. In this manner, the substrate can comprise a metal layer over its full surface area and can be manufactured in a correspondingly cost-favourable manner. Through this third capacitor surface in the varactor according to the invention, a first capacitance value, formed by the third capacitor surface on the substrate and the first movable membrane, can be tapped. Furthermore, a second capacitance value, formed by the third capacitor surface and the second movable membrane, can be tapped in the varactor according to the invention. The third capacitor surface then forms a first varactor terminal. The first capacitor surface and the second capacitor surface together form a second varactor terminal. The varactor according to the invention obtained in this manner then provides a total capacitance value which is obtained from the parallel connection of the first capacitance value to the second capacitance value.

This total capacitance value is insensitive to the effect of an acceleration since the total capacitance is formed from the sum of the first—increasing—capacitance value and the second—decreasing—capacitance value. The difference between the changes of the capacitance values and the acceleration is approximately zero so that the resulting total capacitance value remains constant.

The substrate preferably provides a third varactor terminal in order to achieve a parallel connection of the first capacitance value to the second capacitance value.

In particular, the first membrane and the second membrane are formed from an electrically insulating material. This insulation achieves a decoupling between the capacitor surfaces and the actuator surfaces on the movable membrane. In particular, interference voltages on the direct voltage cannot therefore be coupled onto the capacitor surfaces of the movable membranes. A switching circuit which is connected to the varactor according to the invention is therefore decoupled from the interference voltages of the direct voltage. The varactor is therefore less sensitive to interference.

In a preferred embodiment, the substrate provides a third capacitor surface distanced from the actuator surface. In this context, the substrate is also manufactured from an electrically insulating material in order to achieve a decoupling between first actuator surface and third capacitor surface. The third capacitor surface in this context is preferably embodied on both sides of the substrate, wherein the third capacitor surface can physically comprise two surfaces, but should be regarded electrically as a common capacitor surface. For this purpose, the substrate is preferably provided with a through-contact, in order to connect the third capacitor surface embodied on both sides electrically to one another.

In a preferred embodiment, both a capacitor surface and also a second actuator surface are embodied on the respective membrane. The capacitor surface is embodied distanced from the actuator surface. In this manner, a varactor is manufactured in which the change in the direct voltage provide greater or smaller changes on the resulting capacitance value of the varactor according to the invention. Accordingly, either a substantially larger tuning range of the varactor is obtained, or the capacitance value of the varactor according to the invention can be adjusted substantially more finely, which is designated in the following as a reduced tuning gradient.

In a preferred embodiment, the first membrane and the second membrane are mounted clamped by a fixing at the end of the respective membrane. With this embodiment, the spring constant of the movable membrane influences the tuning range and the adjustment behaviour of the varactor to a high degree.

In particular, the distance between the second actuator surface and the fixing of the respective membrane is smaller than the distance between the capacitor surface and the fixing of the membrane. In this manner, a translation is achieved between the electrostatic force on the actuator surfaces and the resulting capacitance value on the capacitor surfaces. The varactor can therefore be tuned within a relatively large capacitance range.

Alternatively, the distance between the second actuator surface and the fixing is greater than the distance between the capacitor surface and the fixing. As a result of this embodiment, the varactor advantageously provides a substantially reduced tuning gradient.

In an alternative embodiment, the first membrane and the second membrane are mounted clamped in the centre of the membrane by a fixing. Accordingly, the influence of an electrostatic force on the actuator surfaces, which are preferably disposed on one side of the fixing, is opposed to the resulting capacitance value of the varactor which is tapped on the capacitor surfaces, which are arranged on a side of the fixing disposed opposite to the actuator surfaces. A varactor of which the capacitance value becomes reciprocally smaller relative to a corresponding increase in the potential of the direct voltage is thus obtained.

In an alternative embodiment, the first membrane and the second membrane are each mounted clamped by a fixing at both ends of the respective membrane. Through the fixing of both ends, the spring constant of the membrane is increased, so that the influence of an acceleration acting on the membrane from the outside is reduced. A relatively larger spring constant of the membrane is obtained. A construction of this kind is therefore resistant to acceleration. In order to increase the effect of the electrostatic force, such a varactor can provide at least two actuator surfaces on every membrane. The number of actuator surfaces is a parameter for the adjustment of the membrane deflection.

In a preferred embodiment, the membranes mounted in a clamped manner are tapered in the region of their fixing. The reduced spring constant of the membrane obtained in this manner leads to a relatively larger deflection of the membrane upon the application of a direct voltage by comparison with a membrane without tapering. The tuning range of the varactor is therefore increased.

In a preferred embodiment, the distance between the capacitor surface to the substrate is less than the distance between the second actuator surface and the substrate. A relatively greater tuning range of the varactor is therefore obtained.

As an alternative, the distance between the capacitor surface and the substrate is greater than the distance between the second actuator surface and the substrate. A varactor which is tunable with a relatively greater accuracy is obtained in this manner.

In a preferred embodiment, the spring constant of the first movable membrane is different from the second movable membrane. This is conceivable, for example, in the case of the full integration of the varactor, if the layers to be used as movable membranes provide different layer thicknesses because of their structure. This achieves different moments of inertia of area, which can be compensated by direct voltages of different magnitude or exploited in a targeted manner for the tuning of the varactor.

Alternatively or additionally, a width of the first movable membrane is different from the width of the second movable membrane. Accordingly, specified, different layer thicknesses between the substrate and the respective membrane can be compensated on the basis of the structure, or a deliberate tuning can be achieved through the resulting different spring constants, which lead to different moments of inertia of area for the respective membrane.

The varactor according to the invention is preferably arranged as a discrete element on a printed-circuit board. In this context, the printed-circuit board should be regarded as the substrate described so that, in each case, a movable membrane is arranged above and below the substrate as a discrete structural element, and the resulting total capacitance of the varactor is either tapped exclusively from the membranes or is alternatively obtained through parallel connections of the individual capacitance values to form the total capacitance.

Alternatively, the varactor according to the invention is introduced into an integrated switching circuit as a fully integrated structural element. In this context, the movable membranes are embodied in aluminium, bulk silicon, silicon dioxide and/or an alternative material from semiconductor technology.

By preference, the distance between the first movable membrane and the substrate and the distance of the second movable membrane and the substrate from a fixing are adjustable in a manufacturing step of the varactor according to the invention. Accordingly, a spring constant of the second membrane different from the spring constant of the first membrane can be simply compensated. For example, the different spring constants arise with the use of different materials for the membranes and/or different membrane thicknesses.

Alternatively, the distance between the first movable membrane and the substrate differs from the distance of the second movable membrane and the substrate. The difference can be given through a specification of the printed-circuit board structure or of the construction of an integrated semiconductor structure. Different materials of the membranes, a tapering/strengthening of the membranes and/or a use of different direct voltages for adjusting the respective capacitance value are used according to the invention to compensate the resulting distances.

The idea of the invention also includes a varactor system with at least two varactors according to the invention, wherein these varactors are connected in parallel.

Manufacturing tolerances in the manufacture of the varactors cannot be excluded, so that the form of the two membranes of the varactor can be embodied with minimal differences. The influence of an acceleration is therefore not completely compensated. Through parallel connection of a plurality of varactors, manufacturing tolerances of the varactors are averaged out. With a varactor system of this kind, the capacitance noise of the individual varactors is additionally reduced because of the Brownian motion of the gas molecules. In this context, a large scattering of the capacitance value through parallel connection of a plurality of the varactors according to the invention is compensated according to the invention.

The parallel connection of varactors according to the invention is proposed as an alternative, wherein the varactors used provide approximately identical capacitance values and accordingly small manufacturing tolerances. The adjustable total capacitance value of the varactor can therefore be small. A resistance to acceleration is thus achieved even with a few varactors.

In the following, the invention respectively other embodiments and advantages of the invention will be explained in greater detail on the basis of the drawings, wherein the drawings describe only exemplary embodiments of the invention. Identical components in the drawings are provided with identical reference numbers. The drawings should not be regarded as true to scale, individual elements of the drawings may be illustrated in an exaggerated scale respectively with exaggerated simplification.

BRIEF DESCRIPTION OF THE DRAWINGS

The present invention will be understood and appreciated more fully from the following detailed description taken in conjunction with the drawings in which:

FIG. 1 a MEMS-based varactor according to the prior art;

FIG. 3a-3b a further development of the varactor according to the invention illustrated in FIG. 2;

FIG. 4 an alternative embodiment of a varactor according to the invention to that shown in FIG. 3;

FIG. 5a-5b a second further development of the varactor according to the invention illustrated in FIG. 2;

FIG. 6a-6b a third further development of the varactor according to the invention illustrated in FIG. 2;

FIG. 7a-7b a fourth further development of the varactor according to the invention illustrated in FIG. 2;

FIG. 8a-8b a fifth further development of the varactor according to the invention illustrated in FIG. 2;

FIG. 9a-9b a sixth further development of the varactor according to the invention illustrated in FIG. 2;

DETAILED DESCRIPTION OF EMBODIMENTS

Figure 2A:
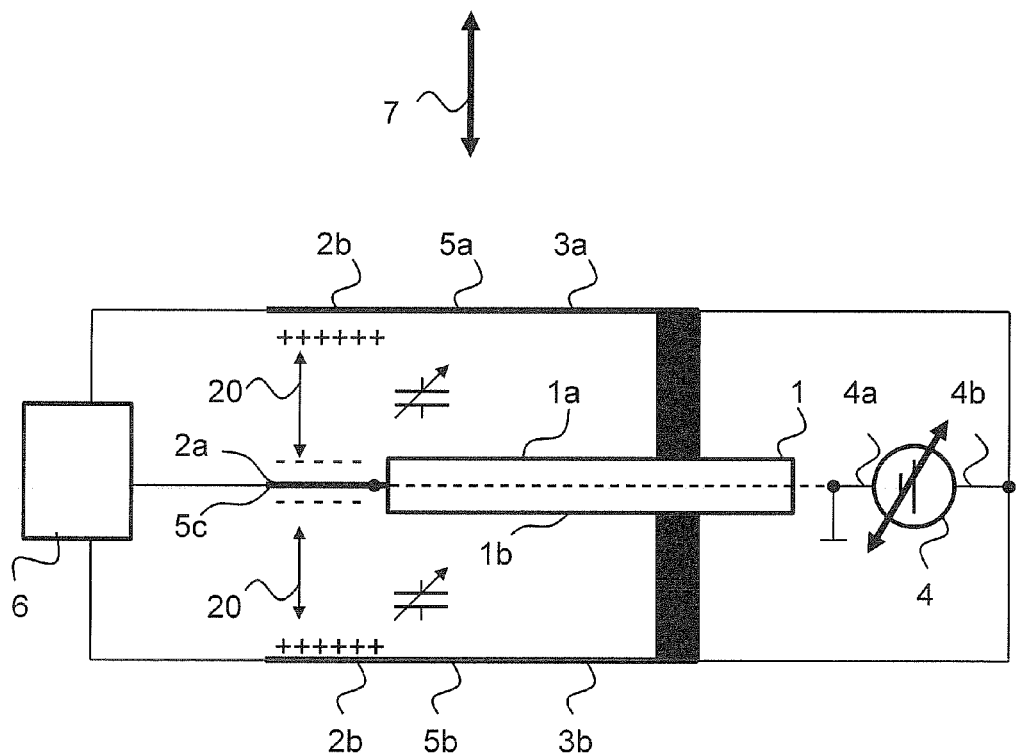
FIG. 2a-2c an exemplary embodiment of a varactor according to the invention.

FIG. 1 shows a varactor according to the prior art. This varactor is manufactured using MEMS technology. The varactor provides a substrate 1 on which at least one first actuator surface 2a is embodied. A movable membrane 3 is arranged above the substrate 1. The membrane 3 is embodied to be electrically conductive.

The functioning of the varactor according to FIG. 1 will now be described. The actuator surface 2a on the substrate 1 is connected in an electrically conducting manner to a first terminal 4a of a direct-voltage source 4. The membrane 3 is connected in an electrically conducting manner to a second terminal 4b of the direct-voltage source 4. Accordingly, the movable membrane 3 is a second actuator surface 2b. By applying the direct voltage by means of the direct-voltage source 4, an electrostatic force 20 is formed between the first actuator surface 2a and the second actuator surface 2b. Because of the spring constant of the material of the movable membrane 3, the movable membrane 3 is positioned by the direct voltage at a certain distance above the substrate 1. An equilibrium is established between electrostatic force and opposing spring constant. Since both the actuator surface 2a and the membrane 3 are embodied to be electrically conducting, the moving membrane 3 and the first actuator surface 2a each represent a capacitor surface 5. A varactor is thus obtained through the adjustable direct-voltage source 4. The capacitor surfaces 5 are connected in an electrically conducting manner to an electrical circuit 6.

Now, if a force 7 acting from the outside is exerted on the varactor, for example, through acceleration, this force 7 either acts against the electrostatic force 20 or amplifies the latter. Accordingly, the adjusted equilibrium of electrostatic force through the direct voltage 4 and the spring constant of the movable membrane 3 is disturbed. As a result, the distance between the electrical membrane 3 and the first actuator surface 2a varies independently of the direct voltage applied from the direct-voltage source 4. During the action of the force 7 acting from the outside, a new, temporary equilibrium is established, wherein the deflection of the movable membrane 3 now depends upon the spring constant of the movable membrane 3, the electrostatic force of the direct voltage 4 and the force 7 acting from the outside. If the force 7 acting from the outside no longer acts on the varactor, the original equilibrium of electrostatic force and spring constant is restored. The effect of such external forces 7 which are achieved especially through an acceleration of the varactor or mechanical vibrations is to change the capacitance value of the varactor because of the change in the deflection of the movable membrane. This influence of the acceleration on a varactor is undesirable according to the invention.

The following FIGS. 2 to 13 show exemplary embodiments of a varactor in which the undesired influence of an acceleration force 7 on the varactor is compensated.

Figure 2B:
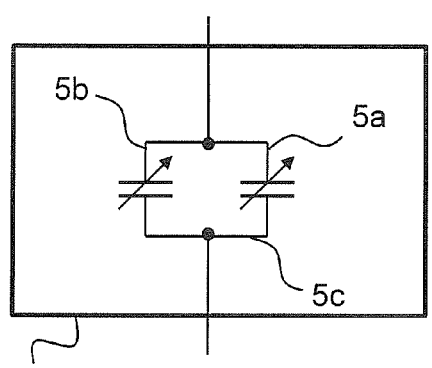
Figure 2C:
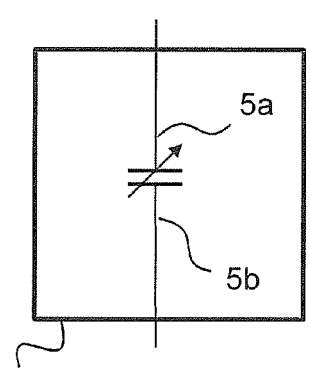

FIG. 2a to FIG. 2c show a first exemplary embodiment of a varactor according to the invention, wherein FIG. 2b and FIG. 2c show different resulting equivalent-circuit diagrams of the varactor illustrated in FIG. 2a. In FIG. 2a, a substrate 1 provides a first upper side 1a and a lower side 1b facing away from the upper side 1a. A first actuator surface 2a is embodied on the substrate 1. The first actuator surface 2a, in this context, can be embodied both on the upper side 1a and also on the lower side 1b of the substrate. Alternatively, the first actuator surface 2a can be a metallised region of the substrate 1, as shown in FIG. 2a.

A first movable membrane 3a is arranged above the upper side 1a of the substrate 1. A second movable membrane 3b is arranged below the lower side 1b of the substrate. In FIG. 2a, the first movable membrane 3a and the second movable membrane 3b are embodied in an electrically conducting manner. The first movable membrane 3a is a first capacitor surface 5a and a second actuator surface 2b. The second movable membrane 3b is a second capacitor surface 5b and a second actuator surface 2b. The first actuator surface 2a is connected in an electrically conducting manner to a first terminal 4a of a direct-voltage source 4. The second actuator surface 2b of the first membrane 3a and also of the second movable membrane 3b is connected in an electrically conducting manner to a second terminal 4b of the direct-voltage source 4. The first movable membrane 3a forms a first capacitor surface 5a. The second movable membrane 3b forms a second capacitor surface 5b. In this context, the first actuator surface 2a is a third capacitor surface 5c.

The first capacitor surface 5a forms a first tunable capacitor with the first actuator surface 2a respectively the third capacitor surface 5c. The second capacitor surface 5b forms a second tunable capacitor with the first actuator surface 2a respectively the third capacitor surface 5c. The first capacitor surface 5a, the second capacitor surface 5b and the third capacitor surface 5c are connected in each case to an electrical circuit 6. The tapped varactor is accordingly either a parallel circuit of the first and of the second tunable capacitor or, in the case of a non-use of the third capacitor surface 5c in the circuit 6, a varactor formed by the first movable membrane 3a and the second movable membrane 3b.

In the following, the functioning of the varactor according to the invention as shown in FIG. 2a will be described. By applying a direct voltage by means of the direct-voltage source 4, a first actuator is obtained above the substrate 1 of which the electrostatic force 20 acts above the substrate 1. Furthermore, a second actuator of which the electrostatic force 20 acts below the substrate 1 is obtained. The electrostatic force 20 on the upper side 1a and on the lower side 1b is regarded as identical in this exemplary embodiment. The electrostatic force 20 can be varied via the voltage level of the direct voltage 4.

The varactor to be applied to the circuit 6 is adjustable exclusively via the movable first membrane 3a and the movable second membrane 3b. This means that the substrate 1 of the varactor is rigid. The consequence of a force 7 acting on the varactor from the outside is that both the upper actuator and also the lower actuator are influenced.

If the spring constants of the membranes 3a and 3b are of the same magnitude, both membranes 3a and 3b move in the same direction subject to the influence of the acceleration force 7. This effect is now exploited in an alternative manner which will be explained with reference to FIG. 2b and FIG. 2c.

According to FIG. 2b, the first capacitor surface 5a, the second capacitor surface 5b and also the third capacitor surface 5c are used for the circuit 6. In this context, the third capacitor surface 5c forms a first varactor terminal. The first capacitor surface 5a and the second capacitor surface 5b form a second varactor terminal of the varactor according to the invention. Accordingly, a parallel circuit is formed from the two individual capacitors. The resulting total capacitance of the varactor for the circuit 6 does not therefore vary, since the capacitance value of parallel-connected capacitors is always the sum of the individual capacitors. An enlargement of the first capacitance value (upper actuator) and simultaneous reduction of the second capacitance value (lower actuator) leads to acceleration-resistant sum of both partial capacitances of the varactor. Accordingly, the force 7 acting from the outside is without influence on the varactor capacitance. However, the adjustability of the varactor-capacitance value by the direct voltage 4 is still given.

According to FIG. 2c, the circuit 6 is connected in an alternative manner. The third capacitor surface 5c in this context is not used in the circuit 6. Instead, the first capacitor surface 5a forms the first varactor terminal, and the second capacitor surface 5b forms the second varactor terminal. The adjustable capacitor is accordingly formed by the first capacitor surface 5a and the second capacitor surface 5b. In this context, the common capacitor surface of the two individual capacitors can be seen in one variant, thereby providing a series circuit of two individual capacitors. Alternatively, the substrate 1 could also act as an additional dielectric. Since both the first capacitor surface 5a and also the second capacitor surface 5b moves in the same direction subject to the action of the force 7 on the varactor, the resulting capacitor does not vary, thereby also obtaining a varactor resistant to acceleration.

In FIGS. 3 to 11, further developments of the varactor according to the invention as specified in FIG. 2 are presented in a simplified manner by way of explanation of the principle. In this context, FIGS. 3 to 12 each provide two viewing perspectives, wherein FIGS. 3a, 4, 5a, 6a, 7a, 8a, 9a, 10a, 11a, 11c and 12a each present the cross-section of the varactor according to the invention, and FIGS. 3b, 5b, 6b, 7b, 8b, 9b, 10b, 11b and 12b each present a plan view of the varactor according to the invention. The formation of the first membrane 3a illustrated in FIGS. 3b, 5b, 6b, 7b, 8b, 9b, 10b, 11b and 12b is identical to the formation of the second membrane 3b which is not illustrated.

The terminals 4a and 4b of the direct-voltage source 4 and the taps for the electrical circuit 6 correspond to the two alternative embodiments specified in FIG. 2b and FIG. 2c. In this context, the first movable membrane 3a and the second movable membrane 3b in FIGS. 3 to 11 are either made from an electrically insulating material in order to decouple the direct voltage of the direct-voltage source 4 from the electrical circuit 6 or made from an electrically conducting material, wherein the decoupling between the direct voltage from the electrical circuit 6 should be implemented in an alternative manner. To avoid repetition, only the differences between the individual FIGS. 2 to 11 will be described.

In FIG. 3a, the first movable membrane 3a is embodied at one end with a fixing 30. Respectively, the second movable membrane 3b is connected to the fixing 30. The ends of the movable membranes 3a and 3b disposed opposite to the fixing 30 oscillate freely. Each of the movable membranes 3a and 3b provides a second actuator surface 2b and a capacitor surface 5a respectively 5b. The substrate 1 provides the first actuator surface 2a. The control of the varactor is implemented as specified in FIG. 2c, so that the capacitor surface 5c need not be embodied on a substrate.

It is evident from FIG. 3b that the second actuator surface 2b is arranged at a distance 13 from the fixing 30. The capacitor surface 5a is arranged at a distance 12 from the fixing 30 on the respective movable membrane 3a or 3b. According to FIGS. 3a and 3b, the distance 13 is shorter than the distance 12. The second actuator surface 2b is disposed at the distance 8 from the respective capacitor surface 5a or 5b.

The construction according to FIGS. 3a and 3b achieves a translation relationship between the electrostatic force 20 of the actuator and the resulting capacitance value of the varactor according to the invention. Accordingly, in the case of controlling of the actuator surfaces 2a, 2b by means of the direct voltage 4, a relatively larger tuning range of the capacitance value for the varactor is obtained than in the case of a comparable direct-voltage control as shown in FIG. 2.

FIG. 4 describes an alternative embodiment of the varactor according to the invention to FIG. 3. The only difference from FIG. 3 is that the substrate provides a third capacitor surface 5c. The control of the varactor is implemented according to FIG. 2b, so that a parallel connection of the individual capacitors in the circuit 6 is implemented.

The third capacitor surface 5c in this context is embodied on the upper side 1a and the lower side 1b on the substrate and connected to the electrical link by means of a through-contact. Alternatively, the third capacitor surface 5c is embodied as a one-piece element in a similar manner to FIG. 2.

In the further development shown in FIG. 5a and FIG. 5b, by way of difference from the exemplary embodiment according to FIG. 3a and FIG. 3b, the actuator surface 2b is exchanged with the capacitor surface 5a, so that the distance 13 is larger than the distance 12. Through this exchange, a varactor is obtained which can be more finely tuned, since a change in the electrostatic force 20 caused by the direct voltage 4 has a relatively smaller influence on the movable membranes 3a and 3b than a comparable direct voltage in the exemplary embodiment according to FIG. 2 or FIG. 3a respectively FIG. 3b.

The exemplary embodiment of FIG. 5a and FIG. 5b shows a further difference from the exemplary embodiment in FIG. 2 and FIG. 3a respectively FIG. 3b. The distance 10 between the first capacitor surface 5a and the substrate 1 is smaller than the distance 11 between the second actuator surface 2b and the substrate 1. Respectively, the distance 10 between the second capacitor surface 5b and the substrate 1 is less than the distance 11 between the second actuator surface 2b and the substrate 1. This different distance leads to a relatively larger tuning range of the resulting varactor by comparison with a varactor according to FIG. 2 or FIG. 3a respectively FIG. 3b.

In the further development according to FIG. 6a and FIG. 6b, by way of difference from the exemplary embodiment according to FIG. 5a and FIG. 5b, the distance of the second actuator surface 2b from the fixing 30 is smaller than the distance 12 of the respective capacitor surface 5a and 5b from the fixing 30. Additionally, the distance 11 between the second actuator surface 2b and the substrate 1 is smaller than the distance between the respective capacitor surface 5a, 5b and the substrate 1.

With the presentation of a varactor as shown in FIG. 6a and FIG. 6b, the adjusted direct voltage of the direct-voltage source 4 can be substantially reduced for tuning and adjustment of the resulting capacitance of the varactor. Alternatively, with the application of a direct voltage comparable to FIG. 2, a relatively finer tuning range of the varactor is obtained.

The exemplary embodiment of FIG. 6a and FIG. 6b shows a further difference from the exemplary embodiments according to FIG. 2 to FIG. 5. In FIG. 6a and FIG. 6b, both the first movable membrane 3a and also the second movable membrane 3b are tapered in the region 14 in the proximity of the fixing 30. Through this tapering 14, the spring constant of the membranes 3a and 3b is reduced, thereby substantially increasing the influence of the direct voltage of the direct-voltage source 4. Accordingly, either the level of the direct voltage can be strongly reduced, or the tuning range of the varactor can be strongly increased. Alternatively, a strengthening both of the first movable membrane 3a and also of the second movable membrane 3b can the implemented in order to achieve an increased spring constant. As a result, the influence of the direct voltage of the direct-voltage source 4 is substantially reduced. Accordingly, either the level of the direct voltage is strongly increased, or the tuning range of the varactor is strongly reduced.

Furthermore, third capacitor surfaces 5c are embodied both on the upper side 1a and also on the lower side 1b of the substrate 1. The control of the resulting varactor is implemented according to FIG. 2b, so that a parallel connection of the individual capacitors is implemented in the circuit 6.

As an alternative which is not illustrated here, the third capacitor surfaces 5c are not embodied on the substrate 1, so that a controlling of the varactor according to the embodiment takes place according to FIG. 2c.

In the exemplary embodiment shown in FIG. 7a and FIG. 7b, by way of difference from the exemplary embodiment of FIG. 6a and FIG. 6b, the second actuator surface 2b is exchanged with the respective capacitor surface 5a or 5b on the respective membrane 3a or 3b. Additionally, a tapering 14 of the membranes 3a and 3b is also provided in the region of the fixing, by means of which the tuning voltage can be reduced. By way of difference from the exemplary embodiment of FIG. 6a and FIG. 6b, the resulting varactor according to FIG. 7a and FIG. 7b is adjustable over a larger capture range.

Furthermore, third capacitor surfaces 5c are embodied both on the upper side 1a and also on the lower side 1b of the substrate 1. The control of the resulting varactor takes place as shown in FIG. 2b, so that a parallel connection of the individual capacitors is implemented in the circuit 6.

As an alternative which is not illustrated, the third capacitor surfaces 5c are not embodied on the substrate 1, so that a control of the varactor is implemented according to the deliberations relating to FIG. 2c.

The different distances of the individual surfaces from the substrate 1 in FIGS. 5a, 6a and 7a are obtained in particular through a spacing element 9 on the respective membrane 3a or 3b. As an alternative which is not illustrated here, the spacing element 9 is embodied on the substrate 1.

FIGS. 8a to 10b describe an alternative embodiment of the varactor according to the invention to that shown in FIGS. 3a to 7b. The substantial difference is the fixing 30 both of the first movable membrane 3a and also of the second movable membrane 3b at both ends of the membranes 3a and 3b. The influences of acceleration are further reduced, since no freely oscillating end of the membranes 3a and 3b is present because of the fixing at both ends, and the spring constant of the movable membranes 3a and 3b is increased.

The exemplary embodiment according to FIG. 8a and FIG. 8b shows that, in each case, two second actuator surfaces 2b are arranged on both the first movable membrane 3a and also on the second movable membrane 3b. In this manner, the respective membranes 3a and 3b bulge when the direct voltage is applied. The first capacitor surface 5a respectively the second capacitor surface 5b arranged between the two second actuator surfaces 2b is then distanced from the substrate 1 by the application of the direct voltage corresponding to the level of the direct voltage.

In a similar manner, third capacitor surfaces 5c are embodied both on the upper side 1a and also on the lower side 1b of the substrate 1. The control of the resulting varactor takes place as shown in FIG. 2b, so that a parallel connection of the individual capacitors is implemented in the circuit 6.

As an alternative which is not illustrated, the third capacitor surfaces 5c are not embodied on the substrate 1, so that a control of the varactor takes place according to the deliberations relating to FIG. 2c.

FIG. 9a and FIG. 9b show a distance 10, comparable with that shown in FIG. 5a and FIG. 7a, between the first capacitor surface 5a and the substrate 1 which is relatively smaller than the distance 11 between the second actuator surface 2b and the substrate 1. In this manner, a relatively greater tunability of the resulting varactor is achieved.

According to FIG. 9a, no third capacitor surfaces 5c are embodied on the substrate 1, so that a control of the varactor is implemented according to the deliberations relating to FIG. 2c.

As an alternative which is not illustrated, third capacitor surfaces 5c are embodied both on the upper side 1a and also on the lower side 1b of the substrate 1. The control of the resulting varactor is then implemented as shown in FIG. 2b, so that a parallel connection of the individual capacitors is implemented in the circuit 6.

Figure 10A:
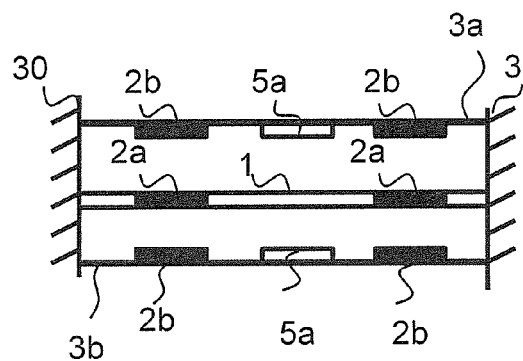
FIG. 10a-10b a seventh further development of the varactor according to the invention illustrated in FIG. 2.
Figure 10B:
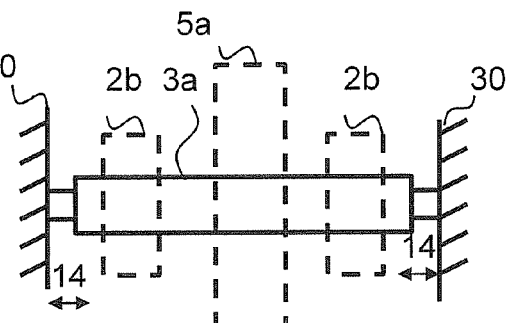

FIG. 10a and FIG. 10b shows a tapering 14 of the first movable membrane 3a and the second movable membrane 3b comparable to FIG. 6b and FIG. 7b. This tapering 14 reduces the spring constant of the respective membrane 3a and 3b, so that a larger capture range of the resulting varactor is achieved, or a relatively smaller direct voltage from the direct-voltage source 4 can be applied in order to obtain the same deflections of the movable membranes 3a, 3b.

Figure 11A:
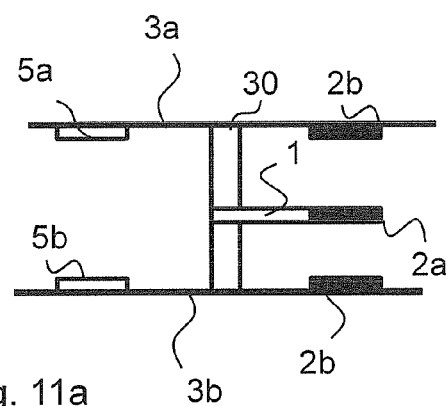
FIG. 11a-11c an eighth further development of the varactor according to the invention illustrated in FIG. 2.
Figure 11B:
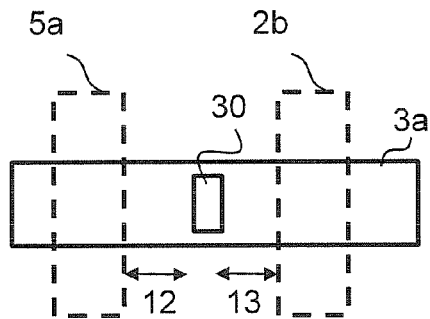
Figure 11C:
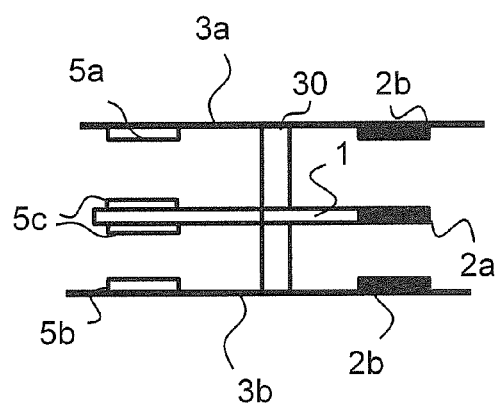

FIG. 11a, FIG. 11b and FIG. 11c show an alternative embodiment of the varactor according to the invention to FIGS. 3 to 7 and FIGS. 8 to 10. In this context, the fixing 30 in FIG. 11a to FIG. 11c is arranged in the centre of the respective membrane 3a, 3b. Accordingly, in FIG. 11b, the fixing 30 is arranged between the first capacitor surface 5a and the second actuator surface 2b on the first membrane 3a. Respectively, the fixing 30 is arranged between the second capacitor surface 5b and the second actuator surface 2b on the second membrane 3b.

In this context, in a first alternative, the distance 12 between the first capacitor surface 5a and the fixing 30 is identical to the distance 13 between the second actuator surface 2b and the fixing 30. A reciprocal behaviour between tuning voltage applied and varactor capacitance is achieved with a varactor embodied in this manner. In a second alternative, a translation relationship between the electrostatic force 20 and the resulting capacitance value of the varactor can be adjusted by varying the distances 12 and 13.

No third capacitance surfaces 5c are embodied in FIG. 11a, so that a control of the resulting varactor is implemented as shown in FIG. 2c.

According to FIG. 11c, by contrast with FIG. 11a, third capacitor surfaces 5c are embodied on the side of the first capacitor surface 5a and the second capacitor surface 5b, both on the upper side 1a and also on the lower side 1b of the substrate 1. The control of the resulting varactor takes place as shown in FIG. 2b, so that a parallel connection of the individual capacitors is implemented in the circuit 6.

Figure 12A:
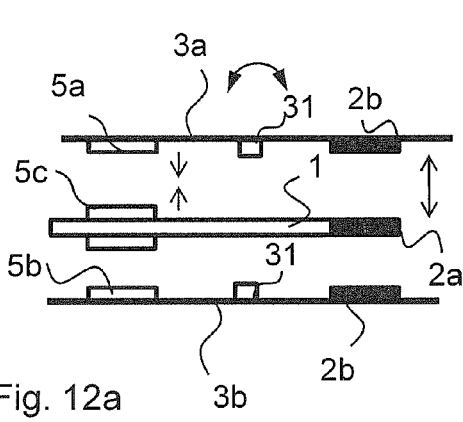
FIG. 12a-12b a ninth further development of the varactor according to the invention illustrated in FIG. 2.
Figure 12B:
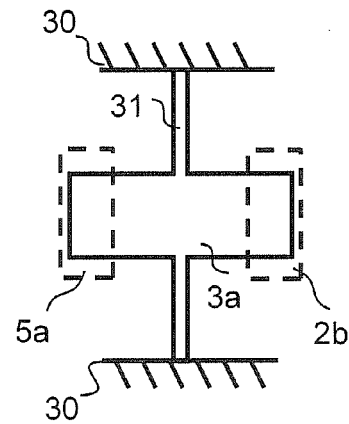

FIGS. 12a and 12b show a further development of the varactor according to the invention presented in FIG. 11a to FIG. 11c. In this context, FIG. 12a shows a cross-section, and FIG. 12b shows a plan view of the varactor according to the invention. By contrast with FIG. 11, the fixing 30 shown in FIG. 12 is not embodied between the substrate 1 and the respective movable membrane 3a, 3b. As an alternative, the fixing 30 in FIG. 12 is embodied on a plane with the respective membrane 3a, 3b. The respective membrane 3a, 3b is arranged in a movable manner via torsion springs 31. With the embodiment of the fixing 30 on the same plane as the membrane 3a, 3b, a full-surface plane can be used with corresponding recesses and metallisations without the need for an additional fixing 30 between substrate 1 and membrane 3. With the application of a direct voltage to the actuator surfaces 2a, 2b, an electrostatic force acts on the torsion spring 31, so that the latter causes a reciprocal deflection because of the reduced width. In this context, the width of the torsion spring 31 adjusts the resulting spring constant which acts against the electrostatic force.

Figure 13:
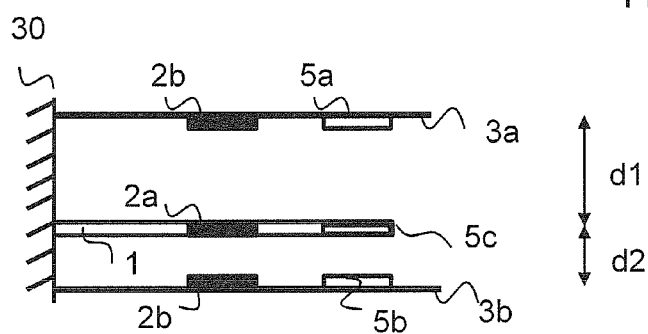
FIG. 13 a tenth further development of the varactor according to the invention illustrated in FIG. 2.

FIG. 13 shows an alternative exemplary embodiment of a varactor according to the invention. By way difference from the preceding Figs., the distance d1 between substrate 1 and the first movable membrane 3a is greater than the distance d2 between substrate 1 and second movable membrane 3b.

This difference in distance is based, in particular, upon a specified layer sequence of a printed circuit board or a specified arrangement of layers and their layer thicknesses in the case of an integrated semiconductor structure. These different distances d1 and d2 must be compensated so that the first capacitance value based upon the capacitor between the substrate 1 and the first movable membrane 3a is of the same magnitude as the second capacitance value based on the capacitor between the substrate 1 and the second movable membrane 3b.

This compensation of the difference in distance is implemented, in particular, through the use of different materials or different thicknesses for the first movable membrane 3a and the second movable membrane 3b. The different spring constant of the membranes 3a and 3b resulting in this manner then generate different deflections of the membrane 3a by comparison with the membrane 3b when the direct-voltage source 4 is applied.

Alternatively, the compensation of the difference in distance is implemented through the tapering 14 respectively strengthening of the first movable membrane 3a or the second movable membrane 3b corresponding to the exemplary embodiment shown in FIG. 6 and FIG. 10. The resulting different spring constant of the membranes 3a and 3b then generate different deflections of the membrane 3a by comparison with the membrane 3b when the direct-voltage source 4 is applied.

Alternatively, the compensation of the difference in distance is implemented by applying different direct-voltage levels between the first movable membrane 3a and the substrate 1 respectively the second movable membrane 3b and the substrate 1. The resulting different deflections of the membranes 3a and 3b then generate different partial capacitance values.

Conversely, the use of different materials for the first movable membrane 3a and the second movable membrane 3b can cause the distances d1 and d2 to be embodied differently. An adjustability of the distances d1 and d2 in order to compensate a different property of the membranes 3a and 3b, for example, through the use of different materials or embodiments of the membranes with different membrane thicknesses, is therefore also contained within the idea of the invention.

As an alternative which is not illustrated, the first capacitor surface 5a can be embodied to be different in size from the second capacitor surface 5b. Because of the different areas of the resulting plate capacitors, different partial capacitances are obtained. Accordingly, different spring constants of the movable membranes 3a, 3b can be compensated or a targeted tuning of the varactor according to the invention can be achieved. Alternatively or additionally, the actuator surfaces 2b on the respective movable membrane 3a or 3b can be embodied with a different size.

The varactor according to the invention shown in FIG. 13 is embodied as shown in FIG. 3 to FIG. 7 with only one fixing 30 at the edge. A construction of the varactor according to FIG. 8 to FIG. 10 or FIG. 11 and FIG. 12 with different distances d1 and d2 is also included in the idea of the invention.

Figure 14:
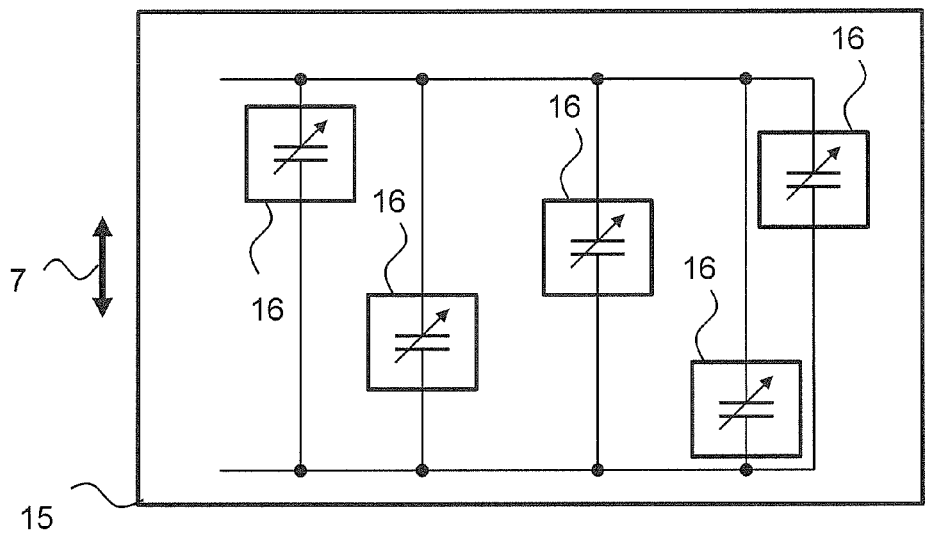
FIG. 14 an exemplary embodiment of the varactor system according to the invention.

FIG. 14 illustrates a varactor system according to the invention. In this context, a plurality of varactors 16 of the type already described here is arranged on a printed circuit board 15. The arrangement of the varactors 16 on the printed circuit board 15 is arbitrary. In particular, the varactors 16 are arranged arbitrarily over the entire area of the printed circuit board 15. All of the varactors 16 are connected in parallel.

However, as a result of manufacturing tolerances of the varactors 16 according to the invention, it is difficult to introduce two identical movable membranes 3a and 3b into a varactor 16. Accordingly, the resulting averaging of the error capacitance in the case of an acceleration of the varactor is not fully compensated. In order to minimise the error in the case of an acceleration of the varactor which occurs as a result of manufacturing tolerances, at least two varactors are connected in parallel in order to achieve a further reduction in the acceleration error. This error reduction is particularly effective in the case of a parallel connection of a plurality of varactors, since the error of the individual varactors 16 is averaged out.

The construction according to FIG. 14 also additionally reduces the capacitance noise of the varactors 16. The varactors 16 are generally operated in a gaseous environment. The gas particles perform Brownian molecular movements dependent upon pressure, type of gas and temperature. In the case of a MEMS-based varactor 16, this means that the gas particles strike the membrane 3 of the varactor 16 and accordingly add a noise to the capacitance. As a result of the parallel connection of several varactors 16, the gas particles strike the individual membranes in an un-correlated manner thereby averaging out the influence of the gas particles.

The varactors can be applied to a printed circuit board 15 either discretely or they are integrated within a semiconductor circuit.

The varactors of the invention described here can be used in particular in the case of integrated VCOs, tunable frequency filters, phase shifters, and similar. In this context, the VCO can be operated from a few kHz up to 2-digit GHz ranges. The susceptibility by comparison with microphony is considerably improved by the varactor according to the invention. The direct-voltage source 4 typically provides a range from 0 to 40 V.

Within the scope of the invention, all of the elements described and/or illustrated and/or claimed can be combined arbitrarily with one another.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

I claim:

1. A varactor with an actuator, wherein a first actuator surface of the actuator is embodied on a substrate, and a second actuator surface is embodied on a first movable membrane,
wherein
the varactor additionally provides a second movable membrane;
the first movable membrane is arranged above an upper side of the substrate; and
the second movable membrane is arranged below the lower side of the substrate facing away from the upper side.

2. The varactor according to claim 1,
wherein,
the first actuator surface provides an electrically conducting connection to a first terminal of a direct-voltage source;
the second actuator surface provides an electrically conducting connection to a second terminal of the direct-voltage source; and
a direct voltage adjusted in the direct-voltage source is set to form an electrostatic force on the first movable membrane and on the second movable membrane.

3. The varactor according to claim 1,
wherein the first movable membrane provides a first capacitor surface, and wherein the second movable membrane provides a second capacitor surface.

4. The varactor according to claim 1,
wherein the first movable membrane and the second movable membrane are embodied from electrically insulating material.

5. The varactor according to claim 1,
wherein the first movable membrane provides a first varactor terminal, and wherein the second movable membrane provides a second varactor terminal.

6. The varactor according to claim 1,
wherein the substrate provides a third capacitor surface, and the substrate provides a third varactor terminal.

7. The varactor according to claim 1,
wherein a capacitor surface and a second actuator surface are embodied in each case on the first movable membrane and on the second movable membrane, and wherein the respective capacitor surface is arranged at a distance from the actuator surface.

8. The varactor according to claim 1,
wherein the first movable membrane and the second membrane are mounted in a movable manner through a fixing at one end of the respective membrane.

9. The varactor according to claim 8,
wherein the distance between the second actuator surface and the fixing of the respective membrane is smaller than the distance between the respective capacitor surface and the fixing of the membrane.

10. The varactor according to claim 8,
wherein the distance between the second actuator surface and the fixing of the respective membrane is greater than the distance between the respective capacitor surface and the fixing of the membrane.

11. The varactor according to claim 1,
wherein the first movable membrane and the second movable membrane are mounted through a fixing clamped in the centre of the respective membrane.

12. The varactor according to claim 1,
wherein the first movable membrane and the second movable membrane are mounted through a fixing clamped in each case at two ends of the membrane.

13. The varactor according to claim 12,
wherein the first movable membrane and the second movable membrane each provide two second actuator surfaces,
wherein a capacitor surface is arranged in each case between the two second actuator surfaces.

14. The varactor according to claim 1,
wherein the first movable membrane and the second movable membrane provides a tapering in the region of a fixing.

15. The varactor according to claim 1,
wherein a capacitor surface and a second actuator surface are embodied in each case on the first movable membrane and on the second movable membrane, and wherein the distance between the respective capacitor surface and the substrate is smaller than the distance between the second actuator surface and the substrate.

16. The varactor according to claim 1,
wherein a capacitor surface and a second actuator surface are embodied in each case on the first movable membrane and on the second movable membrane, and wherein the distance between the respective capacitor surface and the substrate is greater than the distance between the second actuator surface and the substrate.

17. The varactor according to claim 1,
wherein a capacitor surface and a second actuator surface are embodied in each case on the first movable membrane and on the second movable membrane, and wherein the respective capacitor surface provides a size different from the second actuator surface.

18. The varactor according to claim 1,
wherein a capacitor surface is embodied in each case in a different size on the first movable membrane and on the second movable membrane.

19. A varactor system with at least two varactors according to claim 1,
wherein all varactors are connected in parallel.

* * * * *